(12) United States Patent
Bryant et al.

(10) Patent No.: US 6,498,079 B1
(45) Date of Patent: Dec. 24, 2002

(54) METHOD FOR SELECTIVE SOURCE DIFFUSION

(75) Inventors: Frank Randolph Bryant, Denton, TX (US); Kenneth Wayne Smiley, Carrollton, TX (US)

(73) Assignee: STMicroelectronics, Inc., Carrollton, TX (US)

( * ) Notice: Subject to any disclaimer, the term of this patent is extended or adjusted under 35 U.S.C. 154(b) by 87 days.

(21) Appl. No.: 09/627,108

(22) Filed: Jul. 27, 2000

(51) Int. Cl.[7] ................ H01L 21/225; H01L 21/385
(52) U.S. Cl. ............... 438/542; 438/751; 438/756; 438/757; 438/559; 438/563; 438/569; 438/914; 438/923; 438/924; 438/970; 438/976; 438/705; 216/97; 216/99
(58) Field of Search ............... 216/39, 96, 97, 216/99; 438/749, 750, 751, 753, 755, 756, 757, 705, 914, 923, 924, 970, 976, 542, 543, 551, 559, 563, 569

(56) References Cited

U.S. PATENT DOCUMENTS

| | | | |
|---|---|---|---|
| 4,669,176 A | * | 6/1987 | Kato ................... 438/301 |
| 4,676,847 A | * | 6/1987 | Lin ................ 148/DIG. 35 |
| 4,693,781 A | * | 9/1987 | Leung et al. .......... 438/696 |
| 5,273,934 A | * | 12/1993 | Ehinger et al. ........ 437/141 |
| 5,324,684 A | * | 6/1994 | Kermani et al. ... 148/DIG. 30 |
| 5,913,132 A | * | 6/1999 | Tsai ..................... 438/434 |
| 5,985,728 A | * | 11/1999 | Jennings ............... 257/347 |
| 6,184,050 B1 | * | 2/2001 | Hsu ..................... 438/22 |

* cited by examiner

Primary Examiner—Randy Gulakowski
Assistant Examiner—J Smetana
(74) Attorney, Agent, or Firm—Lisa K. Jorgenson; Steven H. Slater

(57) ABSTRACT

Deep profile and highly doped impurity regions can be formed by diffusing from a solid source or doped silicon glass and using a patterned nitride layer. An oxide etch stop and polysilicon sacrificial layer are left in place in the patterned regions and the dopant is diffused through those layers. The polysilicon provides sacrificial silicon that serves to prevent the formation of boron silicon nitride on the substrate surface and also protects the oxide layer during etching of the silicon glass layer. The oxide layer then acts as an etch stop during removal of the polysilicon layer. In this way, no damage done to the substrate surface during the diffusion or subsequent etch steps and the need for expensive ion implanter steps is avoided.

22 Claims, 2 Drawing Sheets

METHOD FOR SELECTIVE SOURCE DIFFUSION

FIELD OF THE INVENTION

This invention relates generally to semiconductor processes and devices and more specifically to a method for forming a highly doped and/or deep profile doped region and the resulting devices formed therefrom.

BACKGROUND OF THE INVENTION

A Several methods are known for forming deep profile and/or highly doped impurity regions. Ion implanters are frequently used to drive impurities into a semiconductor substrate to formed doped regions, as is well known in the art. Such machines cost several millions of dollars each and it would be impractical to use an ion implanter to drive impurities deep into the substrate because of the amount of processing time that would be required. In this context a deep profile is roughly five microns or more. Likewise, for a very high concentration impurity region in the range of around $10^{18}$ atoms/cm$^3$ or more, the time required for processing using an ion implanter would be prohibitively expensive.

As an alternative to ion implanting, some in the art have deposited an impurity containing layer on the surface of the semiconductor substrate (or to selected regions of the substrate) and have diffused the desired impurity into the substrate from the impurity containing layer. One example is the use of a boron silicon glass (BSG) layer being placed on the substrate surface in order to form a highly doped boron region in the substrate.

FIG. 1 illustrates a prior art method for forming a highly doped, deep profile boron region using a BSG layer. Substrate 1 had formed on its major surface an oxide layer 3 over which is formed a masking silicon nitride layer 5. Oxide layer 3 is formed between substrate 1 and nitride layer 5 to minimize stress arising from thermal expansion mismatch between the silicon substrate 1 and the nitride layer 5.

As shown, masking nitride layer 5 and oxide layer 3 have been patterned to form an opening 9 to expose substrate 1. After patterning, boron silicon glass (BSG) layer 7 is formed over the device, overlying silicon masking layer 5 and contacting the surface of substrate 1 in the opening 9. The BSG layer 7 acts as boron source for a subsequent diffusion step. The device is subject to a diffusion step at high temperature (typically 1100–1200 C.) in a nitrogen environment, during which boron migrates from the BSG layer 7 and diffuses into substrate 1, resulting in doped region 11 within the substrate. A thin film of boron silicon nitride 13 is also formed during the diffusion step. This boron silicon nitride is an undesirable consequence of the diffusion step and must be removed prior to further processing.

After diffusion, BSG layer 7 is removed, typically using hydrofluoric (HF) etch. While the HF etch provides desirable properties for removing BSG layer 7, it is not effective at removing the undesirable boron silicon nitride layer 13. Phosphoric acid is used to remove the nitride masking layer 5 as well as to remove the formed boron silicon nitride layer 13. The phosphoric acid exhibits low selectivity to and undesirably etches the silicon substrate as well—this causes damage to the silicon substrate and can have adverse consequences on the electronic devices to be subsequently formed in the silicon substrate.

Therefore, a need exists in the prior art for a method of forming highly doped and/or deep profile impurity regions which is not prohibitively expensive and which does not damage the silicon substrate. The method should also be compatible with conventional processing methods and techniques.

SUMMARY OF THE INVENTION

In one aspect, the present invention provides a method of forming an impurity region in a substrate. The method includes forming an etch stop layer on a surface of the substrate, forming a sacrificial layer on the etch stop layer, and forming a masking layer on the sacrificial layer. The masking layer is patterned to form an opening exposing a region of the sacrificial layer. An impurity source layer is then formed on the masking layer and the exposed region of the sacrificial layer, and an impurity from the impurity source layer is diffuses through the sacrificial layer and etch stop layer and into the substrate, whereby the sacrificial layer traps undesirable impurities.

In another aspect, the invention provides a method of forming doped region in a silicon substrate. The method comprises forming an oxide layer on the substrate, forming a polysilicon layer on the oxide layer, forming a nitride layer on the polysilicon layer, and patterning the nitride layer to form openings to the underlying polysilicon layer. The method further comprises providing an impurity source in proximity to the wafer, and diffusing impurities from the impurity source through the polysilicon layer and the oxide layer into the substrate. Additionally, the method includes removing the nitride layer, removing the polysilicon layer, whereby the oxide layer acts as an etch stop, and removing the oxide layer.

BRIEF DESCRIPTION OF THE DRAWINGS

The above features of the present invention will be more clearly understood from consideration of the following descriptions in connection with accompanying drawings in which.

DETAILED DESCRIPTION OF ILLUSTRATIVE EMBODIMENTS

The making and use of the various embodiments are discussed below in detail. However, it should be appreciated that the present invention provides many applicable inventive concepts that can be embodied in a wide variety of specific contexts. The specific embodiments discussed are merely illustrative of specific ways to make and use the invention, and do not limit the scope of the invention.

Figure 1:
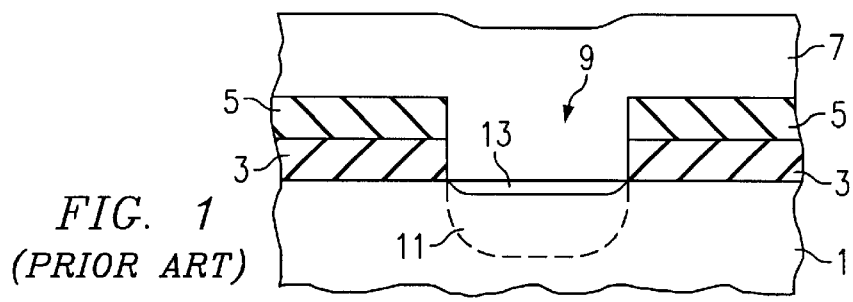
FIG. 1 is an illustration of a prior art approach to forming deep profile high concentration impurity regions.
Figure 2A:
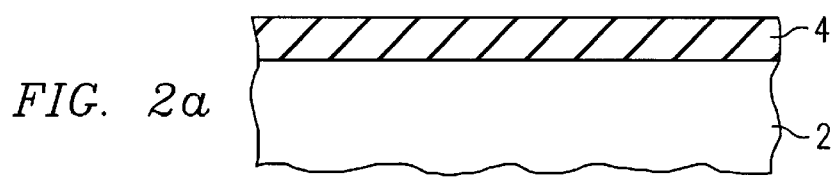
FIGS. 2a through 2g illustrate a preferred embodiment method for forming a high concentration and/or deep profile impurity region.

A first preferred embodiment will now be described, with to FIGS. 2a through 2g, for forming a highly doped, deep profile p-type region in a silicon substrate using boron. In other embodiments, n-type regions can be formed by selecting an appropriate impurity such as phosphorus, or the like. As shown in FIG. 2a, silicon substrate 2 has formed thereon an oxide layer 4. This oxide layer is preferably a thermally grown oxide layer, although the layer could alternatively be a deposited oxide layer. In the preferred embodiment, oxide layer 4 is 50–1,000 Angstroms thick and more preferably about 100 Angstroms thick. Oxide layer 4 provides for stress relief by compensating for the go different thermal expansion coefficients between silicon substrates and a subsequently formed nitride layer, as will be described below.

Figure 2B:
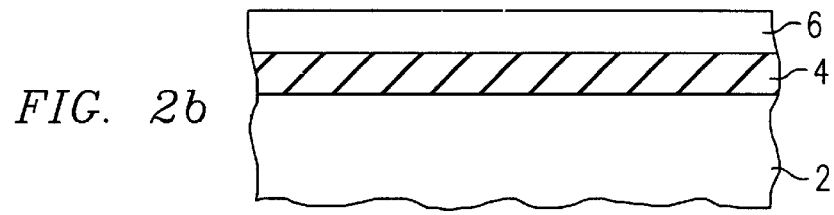

A polysilicon layer 6 is deposited over oxide layer 4 using low pressure chemical vapor deposition (LP CVD) or other well known deposition techniques, as shown in FIG. 2b. In the preferred embodiment, polysilicon layer 6 is deposited using LP CVD at 600 C. and below 500 mTorr (preferably 300 mTorr) using standard silane chemistry. Polysilicon layer 6 is preferably in the range of 50–1,000 Angstroms thick and most preferably about 300–500 Angstroms. An advantageous feature of poly layer 6 is its high boron diffusion rate. Other advantageous features of the layer will become apparent in the following description. These advantageous features could be provided by other materials as well. For instance, an appropriately selected metal oxide layer or silicide layer could be substituted for polysilicon layer 6, provided the substituted layer provided the desirable properties. Those properties include that the layer: allows for good boron diffusion through it; is compatible with the other layers; during etch is selective to the other layers (BSG and oxide); and does not cause any sort of contamination of the silicon, such as by introducing unwanted impurities.

Figure 2C:
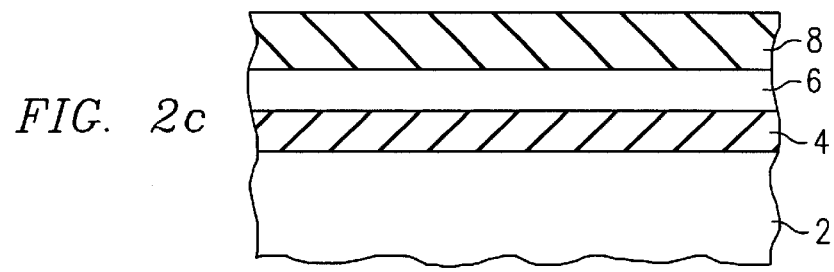

As shown in FIG. 2c, a masking layer 8 is next deposited over poly layer 6. In the preferred embodiments, masking layer 8 is silicon nitride deposited using low pressure chemical vapor deposition (LP DVD), using standard DCS chemistry at 700–800 C. Other well known deposition techniques, such as plasma enhanced CVD (PE CVD) could be used as well. In the preferred embodiments, masking layer 8 is about 200–3,000 Angstroms thick, and more preferably about 1500 to 2000 Angstroms thick. An advantageous feature of masking layer 8 is its characteristic of providing a very low rate of diffusion for boron, hence creating the desired masking property during the subsequent boron diffusion. Another advantageous feature of masking layer 8 is the ability to withstand the high temperatures required for a subsequent diffusion step, as described below.

Figure 2D:
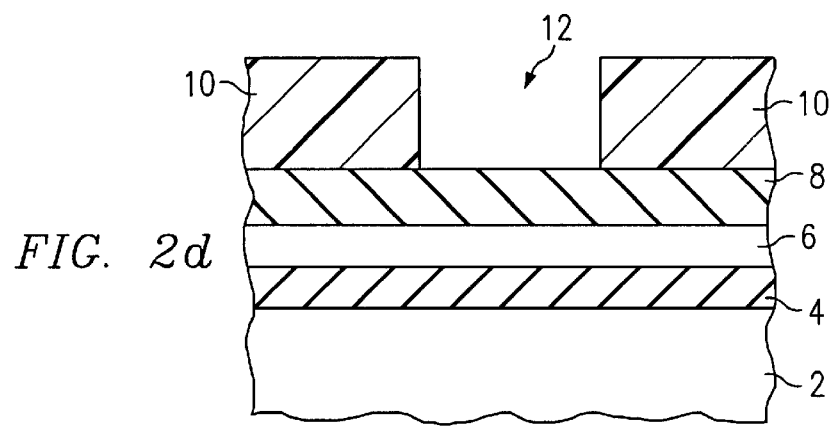
Figure 2E:
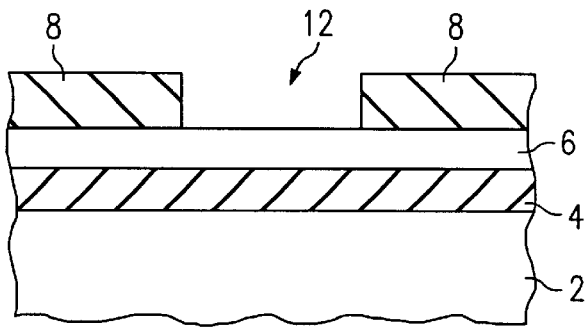

In FIG. 2d, a photoresist layer 10 has been deposited over masking layer 8 and patterned using well known photolithography techniques, thus forming opening 12 through which the underlying masking layer 8 is exposed. These exposed portions of masking layer 8 are then subject to a plasma etch process whereby opening 12 is formed through masking layer 8, after which photoresist layer 10 is removed, as illustrated in FIG. 2e. In other the embodiments, masking layer 8 is etched using a hot phosphoric etch process. Poly layer 6 provides an etch stop as the poly layer is not readily etched by nitride etches. As will be apparent to one skilled in the art, masking layer 8 provides a mask for the subsequent introduction of impurities to selected regions of silicon substrate 2, as will be described in greater detail below.

Figure 2F:
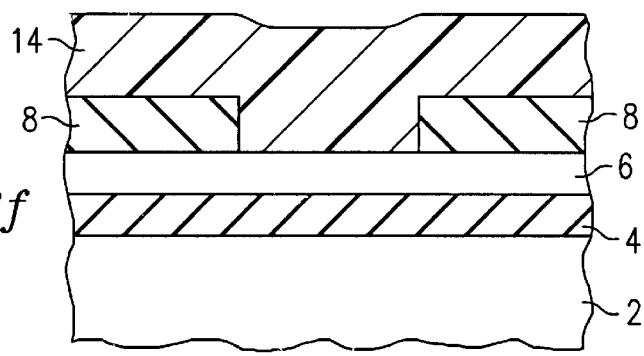

As illustrated in FIG. 2f, an impurity source layer, such as boron silicon glass (BSG) layer 14 is formed over masking layer 8 and fills opening 12, thus contacting poly layer 6. Preferably BSG layer 14 is deposited using atmospheric pressure CVD (AP CVD). In other embodiments, low pressure or plasma enhanced CVD techniques could be employed, as is well known in the art.

Figure 2G:
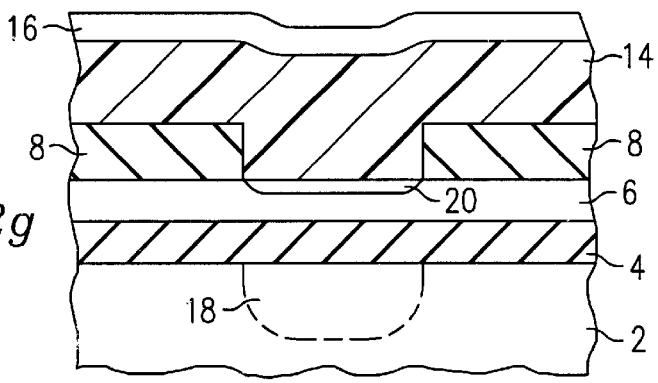

Cap layer 16 is then formed atop BSG layer 14, as shown in FIG. 2g. Cap layer 16 prevents the outgassing of boron from impurity source layer 14 to the atmosphere during the subsequent diffusion step. As one skilled in the art will recognize, the goal is to maximize the diffusion of the desired impurity (in this case boron) into the silicon substrate. Any outgassing of boron from the surface of impurity source layer 14 will lessen the boron available to diffuse into the silicon substrate. For this reason, cap layer 16 is desirable. In the preferred embodiments, cap layer 16 is preferably a silicon oxynitride layer of about 2,000 thickness. Alternatively, silicon nitride or silicon oxide could be used to form cap layer 16. A thicker layer, of preferably about 3000 Angstroms would be required if silicon oxide is used in order to ensure sufficient capping properties. A thinner nitride layer could be used of preferably about 2000 Angstroms.

The device is then subjected to a diffusion step to drive the boron impurities in impurity source layer 14 through poly layer 6 and oxide layer 4 and into silicon substrate 2. Because poly layer 6 and oxide layer 4 provide for relatively free diffusion of boron and because the layers are thin relative to the desired profile of impurity region 18, the imposition of these layers does not significantly affect the resulting profile of diffused impurity region 18, shown in FIG. 2g.

One advantage of the preferred embodiment method is that poly layer 6 acts as a form of sacrificial layer for the formation of boron silicon nitride film 20, rather than the film forming on the surface of substrate 2. In this way, the surface of substrate 2 does not need to be etched in order to remove the film.

After impurity region 18 has been formed, cap layer 16, impurity source layer 14, masking layer 8, poly layer 6 and oxide layer 4 must be removed to allow for further processing of the silicon substrate (such as the formation of electrical or electro-mechanical devices in the substrate). Cap layer 16 is preferably etched using a wet etch process, such as HF etch, which also serves to etch away underlying BSG layer 14. Assuming cap layer is a silicon nitride, hot phosphoric acid is preferably used to remove the layer.

The nitride masking layer is also removed using a conventional wet etch, such as hot phosphoric acid. Typically, some portion of poly layer 6 remains even after mask layer 8 has been etched away. Assuming, however, that poly layer 6 is completely etched away during removal of the nitride masking layer 8, underlying oxide layer 4—which is not affected by conventional nitride etches—acts as an etch stop, thus protecting underlying substrate 2.

Poly layer 6 is then removed using, well known polysilicon etching processes. Note that underlying oxide layer 4 is not affected by the poly etch and hence acts as an etch stop protecting underlying silicon substrate 2. Finally, oxide layer 4 is removed using an oxide etch such as HF, which is selective to oxide and hence does not cause damage to the substrate. In this way, by selecting layers having complementary etch properties, the impurity source layer and the mask layer can be applied and removed without causing damage to the surface of the underlying silicon substrate.

Using the above described preferred embodiment methods, deep profile impurity regions, as deep as ten microns or more, can be practically and inexpensively formed without the need for expensive and time consuming ion implant processes. Because the BSG provides an excellent boron source, very high dopant concentrations—approaching the solid solubility limits of approximately $10^{21}$ atoms/cm$^3$—can be formed. Significantly, no damage to the silicon surface results from removing the masking layer in the preferred embodiments.

Figure 3:
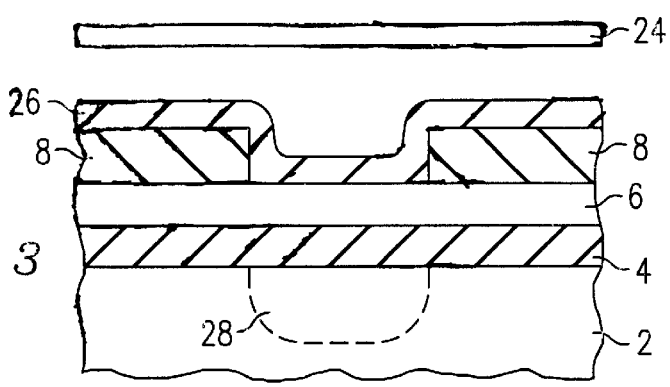
FIG. 3 illustrates an alternate preferred embodiment method for forming a high concentration and/or deep profile impurity region using a solid source.

An alternative preferred embodiment method using a solid boron source in lieu of BSG layer 14 is illustrated in FIG. 3. As shown, silicon substrate 2 has had formed thereon oxide layer 4, polysilicon layer 6, and nitride masking layer 8. In this embodiment, however, the boron source is provided by a solid source 24. Solid source 24 is preferably a disk formed of solid boron nitride, or alternatively a ceramic disk impregnated with boron. In either event, solid disk 24 is brought into close proximity to wafer 2 in a heated Nitrogen environment, preferably with a small percentage (5%) of oxygen. This causes the boron to outgas from solid source 24 and to form a layer of boron oxide 26 on the surface of masking layer 8 and the exposed surface poly layer 6. This boron oxide layer 26 acts as the impurity source layer during a subsequent diffusion step in which the boron is driven from boron nitride layer 26 through poly layer 6 and oxide layer 4, and forms impurity region 28.

The described methods are useful any time a boron diffusion profile is desired that provides for a high concentration and/or deep profile. Examples might include deep junction devices, discrete devices, selective silicon etch stops, micromachining, and the like.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. For instance, while the preferred embodiments are described with respect to a silicon substrate, other substrates such as gallium arsenide may be employed, with appropriate modification to the described embodiments. Routine experimentation will also reveal other layer thicknesses and compositions than those described herein. Various other modifications and embodiments will be apparent to one skilled in the art. It is therefore intended that the appended claims encompass any such modifications or embodiments.

What is claimed is:

1. A method of forming an impurity region in a substrate comprising:
    forming an etch stop layer on a surface of the substrate;
    forming a sacrificial layer on the etch stop layer;
    forming a masking layer on the sacrificial layer;
    patterning the masking layer to form an opening exposing a region of the sacrificial layer;
    forming an impurity source layer on the masking layer and the exposed region of the sacrificial layer; and
    diffusing an impurity from the impurity source layer through the sacrificial layer and etch stop layer and into the substrate, whereby the sacrificial layer traps undesirable impurities.

2. The method of claim 1 further comprising forming a cap layer on the impurity source layer.

3. The method of claim 1 wherein the etch stop layer is comprised of silicon oxide, the sacrificial layer is comprised of polysilicon, and the masking layer is comprised of silicon nitride.

4. The method of claim 1 wherein the etch stop layer has a thickness of about 50 to 1000 Angstroms.

5. The method of claim 1 wherein the sacrificial layer has a thickness of about 50 to 1000 Angstroms.

6. The method of claim 1 wherein the masking layer has a thickness of about 200 to 3000 Angstroms.

7. The method of claim 1 further comprising:
    etching the silicon substrate, whereby the impurity region etches more slowly than the surrounding silicon substrate.

8. The method of claim 1 further comprising:
    removing the impurity source layer;
    removing the masking layer;
    removing the sacrificial layer; and
    removing the etch stop layer.

9. The method of claim 8 wherein the sacrificial layer acts as an etch stop during the removal of the impurity source layer.

10. The method of claim 8 wherein the etch stop layer acts as an etch stop during the removal of the masking layer.

11. The method of claim 1 wherein the impurity source layer is comprised of boron silicon glass.

12. The method of claim 11 wherein the impurity source layer is comprised of phosphorous silicon glass.

13. A method of forming a doped region in a silicon substrate, comprising:
    forming an oxide layer on the substrate;
    forming a polysilicon layer on the oxide layer;
    forming a nitride layer on the polysilicon layer;
    patterning the nitride layer to form openings to the underlying polysilicon layer;
    providing an impurity source in proximity to the wafer;
    diffusing impurities from the impurity source through the polysilicon layer and the oxide layer into the substrate;
    removing the nitride layer;
    removing the polysilicon layer, whereby the oxide layer acts as an etch stop; and
    removing the oxide layer.

14. The method of claim 13 wherein the step of providing an impurity source in proximity to the wafer comprises forming a doped silicon glass over the nitride layer and exposed regions of the polysilicon layer.

15. The method of claim 14 further comprising the step of removing the doped silicon glass after the diffusion step, and wherein the polysilicon layer acts as an etch stop during the step of removing the doped silicon glass.

16. The method of claim 14 wherein the doped silicon glass is boron silicon glass.

17. The method of claim 14 further comprising forming a cap layer over the doped silicon glass.

18. The method of claim 17 wherein the layer is selected from the group consisting of silicon oxide, silicon oxynitride and silicon nitride.

19. The method of claim 13 wherein the step of providing an impurity source in proximity to the wafer comprises placing a boron containing disk near the wafer in a heated environment.

20. The method of claim 19 wherein the boron containing disk comprises ceramic and boron.

21. The method of claim 19 wherein the boron containing disk comprises boron nitride.

22. A method of diffusing an impurity into a substrate, comprising:
    forming a first layer on a surface of a substrate;
    forming a second layer on the first layer;
    forming a masking layer on the second layer;
    forming at least one opening in the masking layer through which at least one region of the second layer is exposed;
    forming an impurity source layer on top of the masking layer and the at least one region of the second layer;
    diffusing the impurity from the impurity source layer through the first and second layers and into the substrate;
    removing the impurity source layer using an etch solution, wherein the second layer acts as an etch stop;
    removing the second layer using a second etch solution, wherein the first layer acts as an etch stop; and
    removing the first layer.

* * * * *